United States Patent
Gladd et al.

(10) Patent No.: US 7,674,972 B2
(45) Date of Patent: Mar. 9, 2010

(54) FOLD-IN BRAIDED SHIELD

(75) Inventors: Joseph H. Gladd, Cortland, OH (US); William C. Ketterer, Girard, OH (US); Frederick D. Esenwein, Canfield, OH (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/986,324

(22) Filed: Nov. 21, 2007

(65) Prior Publication Data

US 2009/0126987 A1 May 21, 2009

(51) Int. Cl.
*H01B 11/02* (2006.01)
*H01B 11/06* (2006.01)
*H05K 9/00* (2006.01)

(52) U.S. Cl. .................. 174/34; 174/386; 174/392; 174/371

(58) Field of Classification Search .......... 174/357, 174/359, 376, 386, 392, 34, 371; 361/816, 361/818, 800; 439/607.27, 607.45
See application file for complete search history.

(56) References Cited

U.S. PATENT DOCUMENTS

| | | | |
|---|---|---|---|
| 3,648,224 A | 3/1972 | McDonough | |
| 4,497,533 A | 2/1985 | Genova et al. | |
| 5,028,742 A | 7/1991 | Redman | |
| 5,267,878 A | 12/1993 | Shinji et al. | |
| 5,329,064 A | 7/1994 | Tash et al. | |
| 5,496,968 A | 3/1996 | Katoh et al. | |
| 5,709,450 A * | 1/1998 | Francis et al. | 362/546 |
| 6,048,227 A | 4/2000 | Rupp et al. | |
| 6,107,572 A | 8/2000 | Miyazaki | |
| 6,648,690 B2 | 11/2003 | Saito et al. | |
| 7,228,625 B1 | 6/2007 | Zerebilov | |
| 7,494,384 B2 * | 2/2009 | Friedhof | 439/701 |
| 2002/0134565 A1 | 9/2002 | Hashizawa et al. | |
| 2003/0092321 A1 | 5/2003 | Schauer et al. | |
| 2003/0221850 A1 | 12/2003 | Mizutani et al. | |
| 2005/0266729 A1 | 12/2005 | Fukushima et al. | |
| 2008/0254665 A1 | 10/2008 | Friedhof | |

OTHER PUBLICATIONS

European Search Report dated Mar. 31, 2009.

* cited by examiner

*Primary Examiner*—Hung V Ngo
(74) *Attorney, Agent, or Firm*—Thomas N. Twomey

(57) ABSTRACT

A braided shield includes a housing formed from a plurality of wires braided together and having a dual-layer configuration. The housing has an outer layer integrally formed with an inner layer. A support is at least partially disposed in the housing, and the inner layer is disposed between the support and the outer layer. The inner layer and outer layer reduce electromagnetic radiation leakage into/out of the housing by reducing the number of holes in the housing. Forming the braided shield includes providing the housing, which defines a longitudinal axis and a passage extending along the longitudinal axis. The housing has an end portion, and the end portion is compressed transverse to the longitudinal axis. The end portion is then forced into the passage. Accordingly, the braid shield reduces or eliminates electromagnetic radiation while providing a strong and consistent crimp with the support.

8 Claims, 4 Drawing Sheets

FOLD-IN BRAIDED SHIELD

FIELD

The present embodiments generally relate to a fold-in braided shield and a method of forming the fold-in braided shield.

BACKGROUND

Although electromagnetic radiation can be generated from any number of sources, including natural phenomenon like lightning strikes, the emergence of electronic devices, and specifically telecommunication devices, has rapidly increased the amount of electromagnetic radiation propagating through the air. This external electromagnetic radiation can interfere with electronic devices by causing a current to flow through wires and other metallic objects. Since this extraneous current may generate unwanted signals, including a spike in current that can damage electronic components, some treat the rapid increase in electromagnetic radiation as a form of pollution. In addition, electromagnetic energy produced from internal electromagnetic sources, such as high current cables, can also radiate out of the wire and interfere with other electronic devices.

One way to combat these extraneous currents is to protect the wires of electronic devices from external electromagnetic radiation by using a braided metallic shield that covers and extends along the length of the wire. The braided metallic shield also prevents electromagnetic radiation from leaking out of the wire, reducing interference to external devices. A terminal end of the shield may include a solid metal support that is crimped to the shield. When the support is placed inside the shield, the terminal end of the shield is expanded, which separates the wires that form the braid in the shield, creating "holes." Unfortunately, the "holes" provide a means for electromagnetic radiation to penetrate through the wire and interfere with transmitted signals on the wire. Also, as the terminal end of the shield ages, the wires that make up the shield may begin to unravel, causing additional "holes" in the shield. In addition, the unraveling weakens the crimp to the metal support, resulting in the braid having reduced pull strength. Finally, the terminal end of the shield, as it begins to unravel, can cause galvanic corrosion between the shield and the metal support.

Accordingly, a braid shield is needed that reduces or eliminates the number of holes in the shield to reduce or eliminate electromagnetic radiation into and out of the cable while providing a strong and consistent crimp with the support.

SUMMARY

A braided shield includes a housing having an outer layer and a support at least partially disposed in the housing and spaced from the outer layer. The housing further includes an inner layer integrally formed with the outer layer and disposed between the outer layer and the support to establish a dual-layer configuration.

A method of forming the braided shield includes providing a housing having an end portion and defining a longitudinal axis and a passage extending along the longitudinal axis, compressing the end portion transverse to the longitudinal axis, and forcing the end portion into the passage to define the housing having an outer layer and an inner layer integrally formed with the outer layer.

BRIEF DESCRIPTION OF THE DRAWINGS

The present embodiments become better understood by reference to the following detailed description when considered in connection with the accompanying drawings, wherein.

DETAILED DESCRIPTION

A braided shield includes a housing having a dual-layer configuration. The housing is formed from a plurality of wires braided together and has an outer layer integrally formed with an inner layer to establish the dual-layer configuration. A support is at least partially disposed in the housing, and the inner layer is disposed between the support and the outer layer. The inner layer and outer layer reduce the amount of electromagnetic radiation that leaks into or out of the housing by reducing the number of holes in the housing. Forming the braided shield includes providing the housing, which defines a longitudinal axis and a passage extending along the longitudinal axis. The housing has an end portion, and the end portion is compressed transverse to the longitudinal axis. The end portion is then forced into the passage. Forming the braided shield with this method helps prevent the plurality of wires from unraveling and reduces corrosion between the housing and the support. Accordingly, the braided shield provided herein reduces or eliminates the number of holes in the shield to reduce or eliminate electromagnetic radiation from entering or exiting a cable while providing a strong and consistent crimp with the support. Such a cable may be useful in any industry or application, including, but not limited to, an electric vehicle's propulsion system wiring to prevent from a radio or other electronic sources.

Figure 1:
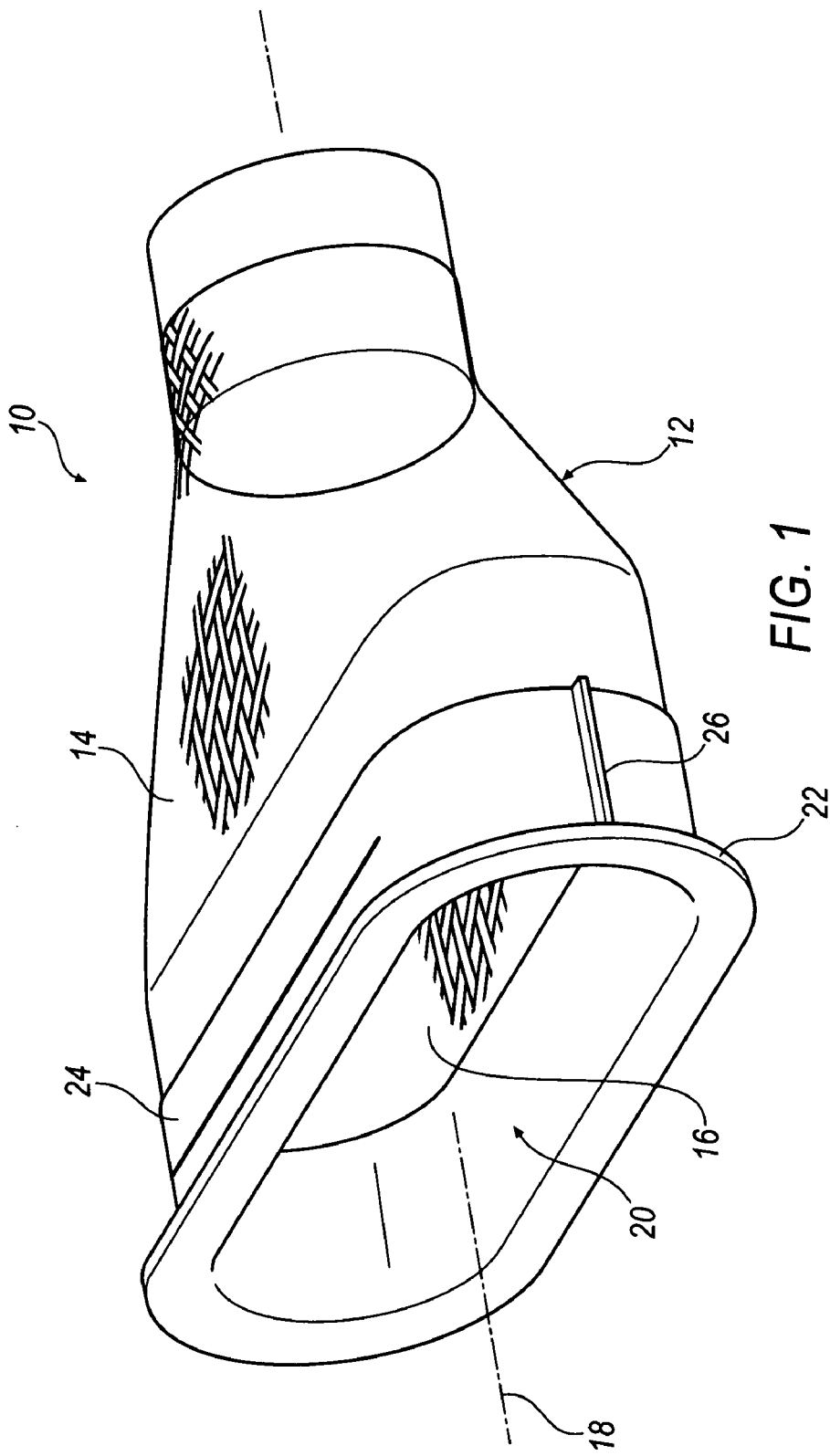
FIG. 1 is a perspective view of a braided shield according to an embodiment.

Referring to the figures, wherein like numerals indicate like or corresponding parts throughout the several views, an exemplary braided shield is shown at numeral 10. FIG. 1 is a perspective view of an exemplary embodiment of the braided shield 10 that includes a housing 12 with a dual-layer configuration. The housing 12 has an outer layer 14 and an inner layer 16 integrally formed to establish the dual-layer configuration. In one embodiment, the outer layer 14 and the inner layer 16 need not be integrally formed. Instead, the inner layer 16 may be a separate piece that is inserted into the outer layer 14. The housing 12, including the outer layer 14 and the inner layer 16, may be formed from a plurality of wires braided together to block interference from electromagnetic radiation while remaining flexible. The housing 12 may be formed from any type of wire known, including, but not limited to, copper or copper coated with tin. As shown in FIG. 1, the housing 12 has a generally cylindrical shape, although it is to be appreciated that the housing 12 may be formed to any shape. Indeed, a portion of the housing 12 may have one shape and another portion of the housing 12 may have another shape. For instance, a portion of the housing 12 may have a generally cylindrical shape, while another portion of the housing 12 may have a generally elliptical shape. In either embodiment, the housing 12 defines a longitudinal axis 18 extending along a length of the housing 12. The housing 12 further defines a passage 20 through the length of the housing 12 along the longitudinal axis 18.

A support 22 is at least partially disposed in the passage 20 of the housing 12. The support 22 has a relatively rigid structure for generally retaining the shape of the housing 12 when assembled. The support 22 may be formed from any known material. For instance, the support 22 may be formed from steel or aluminum. Also, the support 22 may be coated with a metal such as tin. It is to be appreciated that the support 22 may be formed from or coated with other materials known in the art.

A crimp band 24 is disposed on the outer layer 14 for securing the support 22 to the housing 12. The crimp band 24 may be formed from any material known in the art. For instance, the crimp band 24 may be formed from steel and plated with tin. The crimp band 24 includes at least one crimp end 26 that may be compressed, effectively shortening the circumference of the crimp band 24. When the crimp end 26 is compressed, the crimp band 24 holds the housing 12 and the support 22 together free from any nut and bolt as shown in the drawings.

Figure 2:
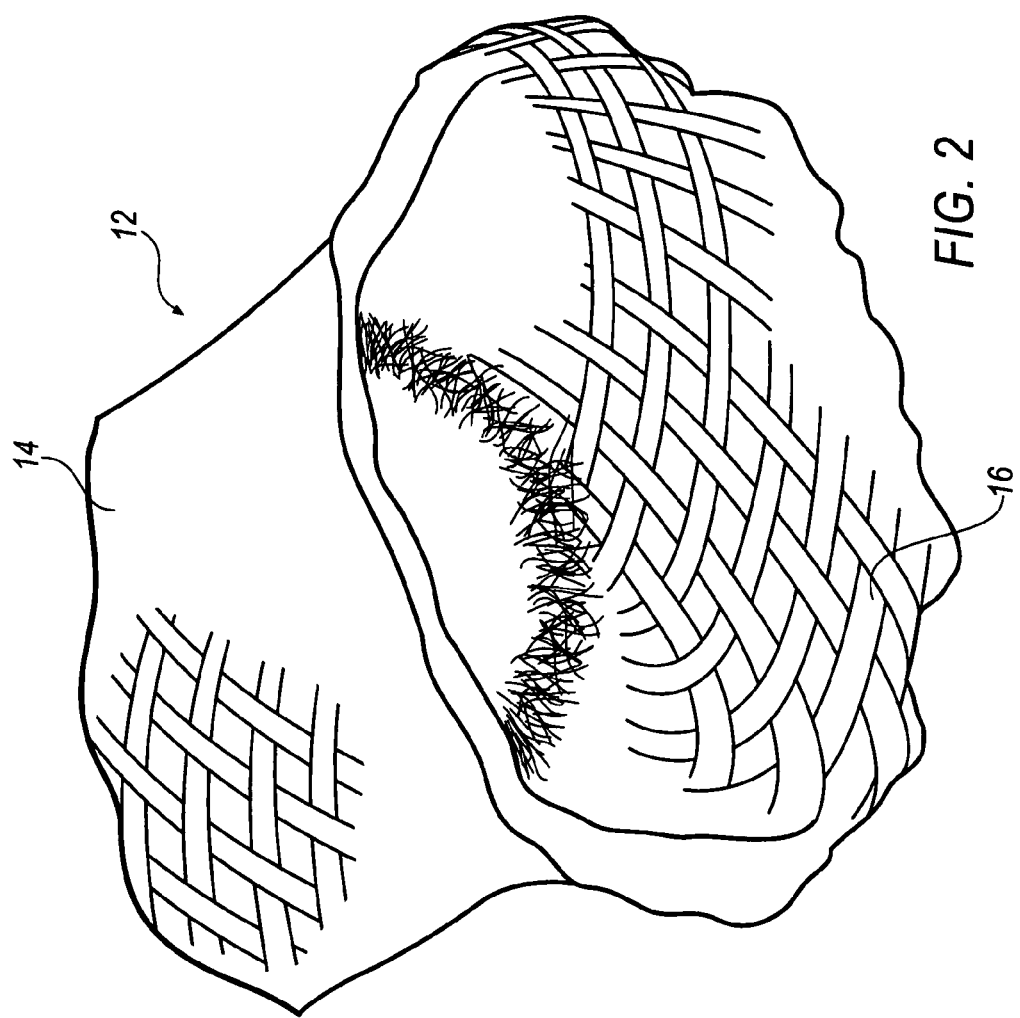
FIG. 2 is a perspective view of a housing having an outer layer and an inner layer integrally formed with the outer layer.

FIG. 2 is a perspective view of an exemplary embodiment of the housing 12. The inner layer 16 is integrally formed with the outer layer 14. Since the inner layer 16 is integrally formed with the outer layer 14, the inner layer 16 is also formed from the plurality of wires braided together.

Figure 3:
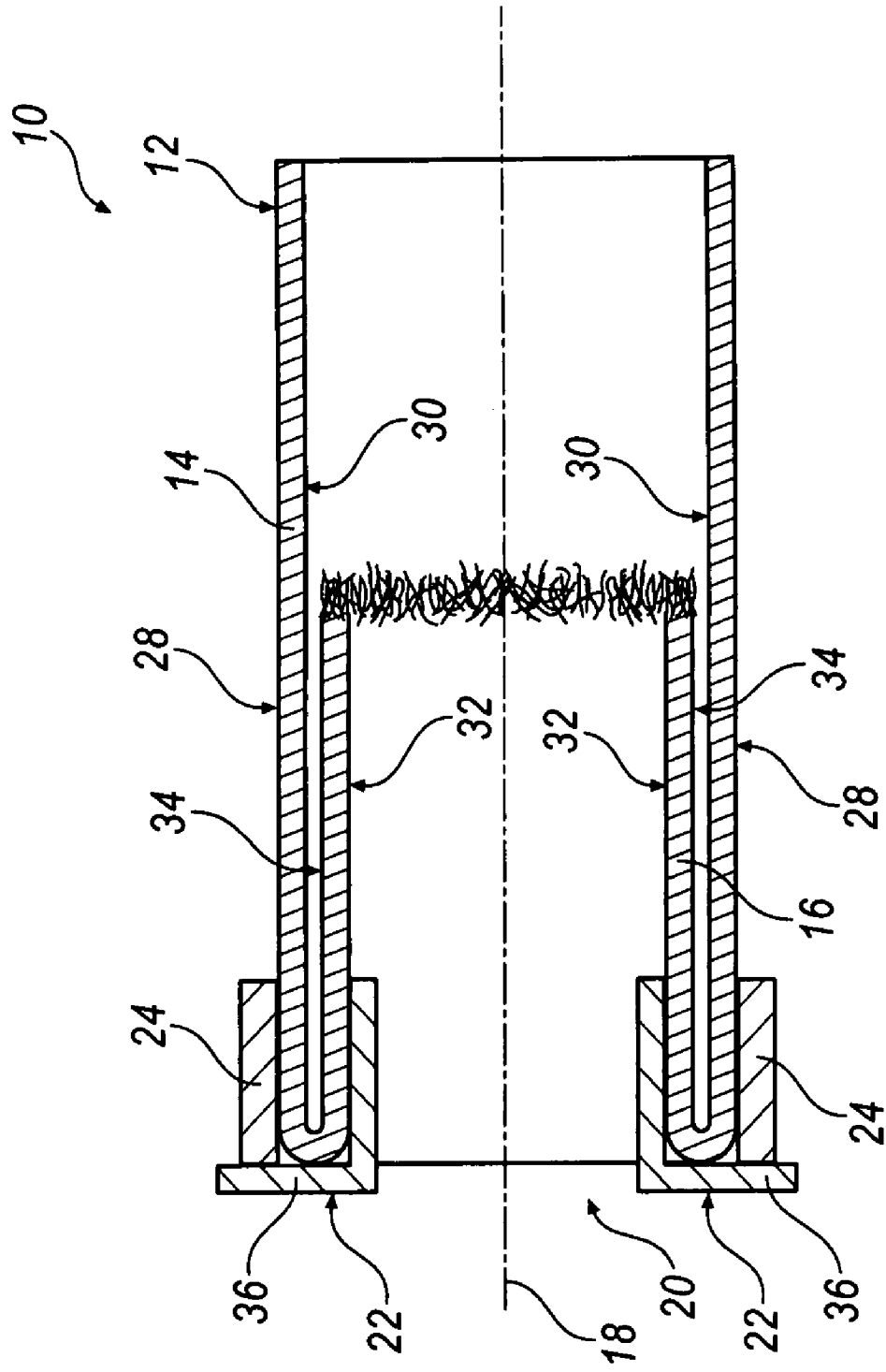
FIG. 3 is a cross-sectional side view of the braided shield of FIG. 1 according to an embodiment.

FIG. 3 is a cross-sectional side view of an exemplary embodiment of the braided shield 10. In this embodiment, the inner layer 16 is folded into the outer layer 14 to establish the dual-layered configuration. As shown in FIG. 3, the outer layer 14 has an exposed surface 28 and an internal surface 30. The support 22 is disposed in the passage 20 spaced from the internal surface 30 of the outer layer 14. The inner layer 16 is disposed at least partially between the outer layer 14 and the support 22. Like the outer layer 14, the inner layer 16 has an exposed surface 32 and an internal surface 34. At least a portion of the internal surface 34 of the inner layer 16 is disposed on at least a portion of the internal surface 30 of the outer layer 14. In an embodiment where the inner layer 16 is folded into the outer layer 14, the internal surface 30 of the outer layer 14 is the same as the internal surface 34 of the inner layer 16. The support 22 is disposed on the exposed surface 32 of the inner layer 16. The inner layer 16 defines at least a portion of the passage 20, and the support 22 is disposed on the internal surface 34 of the inner layer 16 inside the passage 20.

The support 22 may further include a lip 36 integrally formed with and extending from the support 22 transverse to the longitudinal axis 18. The lip 36 limits movement of the support 22 along the longitudinal axis 18. The lip 36 may also align the crimp band 24 with the end of the housing 12.

Figure 4:
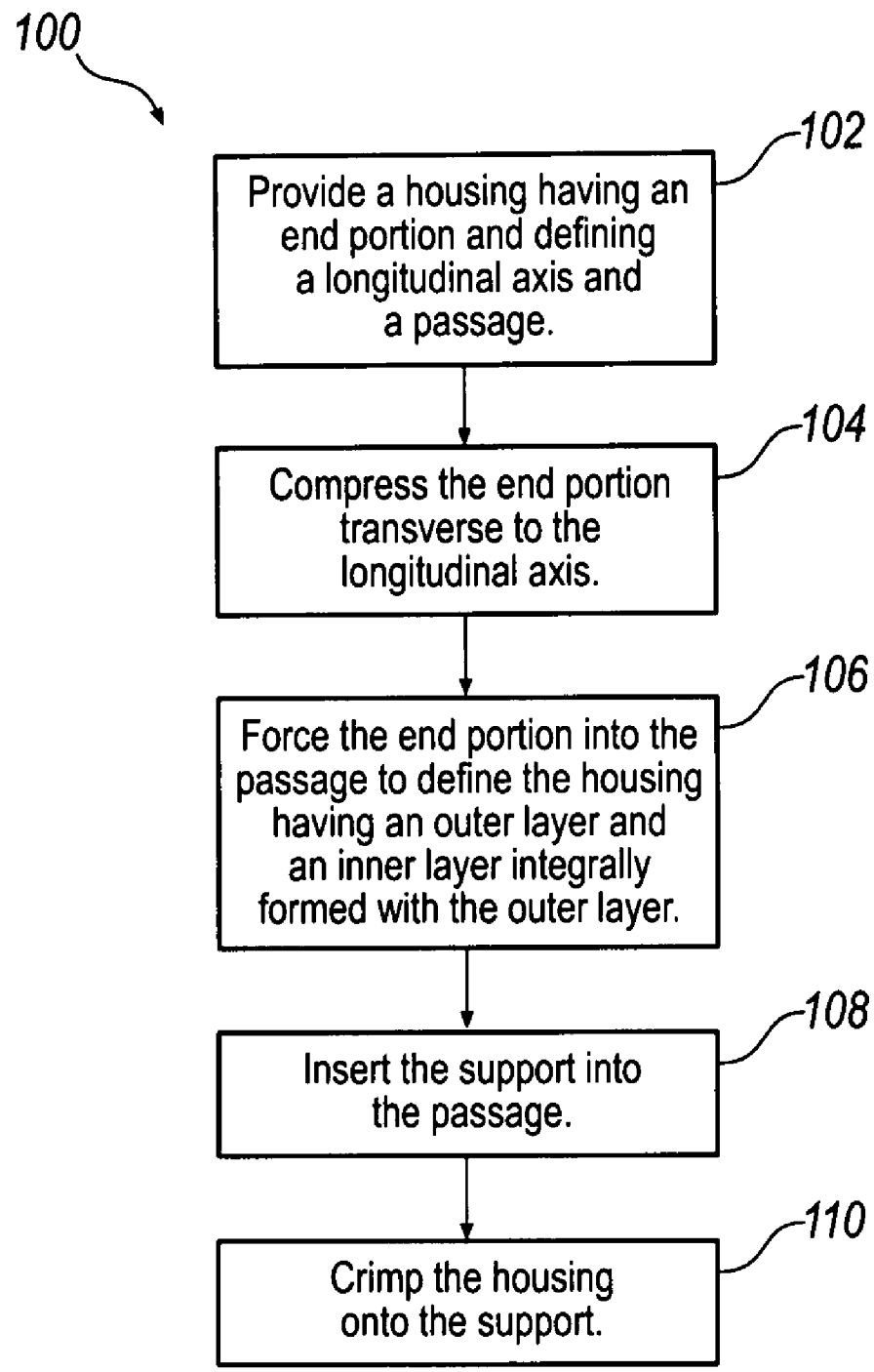
FIG. 4 is a flow chart of a method of forming the braided shield according to an embodiment.

FIG. 4 is a flowchart of an exemplary embodiment of a method 100 of forming the braided shield 10. The method 100 includes a step 102 of providing the housing 12 having an end portion and defining the longitudinal axis 18 and the passage 20 extending along the longitudinal axis 18. Providing the housing 12 may include braiding a plurality of wires to form the housing 12 and/or designating a portion of the housing 12 as the end portion. The method 100 also includes a step 104 of compressing the end portion transverse to the longitudinal axis 18. Furthermore, the method 100 includes a step 106 of forcing the end portion into the passage 20 to define the housing 12 having an outer layer 14 and an inner layer 16 integrally formed with the outer layer 14. The step 106 of forcing the end portion into the housing 12 may include compressing the housing 12 along the longitudinal axis 18, expanding the outer layer 14, and/or folding the inner layer 16 into the passage 20. Next, the method 100 may include a step 108 of inserting the support 22 into the passage 20. Once the support 22 is inserted, the method 100 may include a step 110 of crimping the housing 12 onto the support 22. Crimping the housing 12 may include clamping the crimp band 24 onto the housing 12.

It is to be understood that the above description is intended to be illustrative and not restrictive. Many alternative approaches or applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future examples. In sum, it should be understood that the invention is capable of modification and variation and is limited only by the following claims.

The present embodiments have been particularly shown and described, which are merely illustrative of the best modes. It should be understood by those skilled in the art that various alternatives to the embodiments described herein may be employed in practicing the claims without departing from the spirit and scope as defined in the following claims. It is intended that the following claims define the scope of the invention and that the method and apparatus within the scope of these claims and their equivalents be covered thereby. This description should be understood to include all novel and non-obvious combinations of elements described herein, and claims may be presented in this or a later application to any novel and non-obvious combination of these elements. Moreover, the foregoing embodiments are illustrative, and no single feature or element is essential to all possible combinations that may be claimed in this or a later application.

All terms used in the claims are intended to be given their broadest reasonable constructions and their ordinary meanings as understood by those skilled in the art unless an explicit indication to the contrary is made herein. In particular, use of the singular articles such as "a," "the," "said," etc. should be read to recite one or more of the indicated elements unless a claim recites an explicit limitation to the contrary.

What we claim is:

1. A braided shield comprising:
    a housing having an outer layer;
    a support at least partially disposed in said housing;
    wherein said housing further includes an inner layer integrally formed with said outer layer and disposed at least partially between said outer layer and said support to establish a dual-layer configuration;
    said inner layer defines a passage and said support is disposed on said inner layer in said passage and maintaining said passage to be substantially open through said support; and
    a crimp band disposed on said outer layer and having at least one compressed crimp for securing said support to said housing, said crimp free from any nut and bolt.

2. A braided shield as set forth in claim 1 wherein said outer layer and said inner layer are formed from a plurality of wires.

3. A braided shield as set forth in claim 2 wherein said plurality of wires are braided.

4. A braided shield as set forth in claim 1 wherein said support includes a lip integrally formed with and extending from said support in a direction transverse to a longitudinal axis defined by said housing and in an outward direction about said open passage.

5. A braided shield as defined in claim 4 further comprising:
said crimp band disposed on said outer layer and being adjacent said lip.

6. A braided shield as set forth in claim 1 wherein said outer layer and said inner layer each have an exposed surface and an internal surface.

7. A braided shield as set forth in claim 6 wherein at least a portion of said internal surface of said inner layer is disposed on at least a portion of said internal surface of said outer layer.

8. A braided shield as set forth in claim 6 wherein said support is disposed on said radially inward facing surface of said inner layer.

* * * * *